(12) United States Patent
Faber et al.

(10) Patent No.: US 8,597,565 B2
(45) Date of Patent: Dec. 3, 2013

(54) METHOD FOR FORMING MICROSCOPIC 3D STRUCTURES

(75) Inventors: Jacob Simon Faber, Eindhoven (NL); Johannes Jacobus Lambertus Mulders, Eindhoven (NL); Alan Frank de Jong, Eindhoven (NL); Carmen Francisca Maria van Vilsteren, Eindhoven (NL)

(73) Assignee: FEI Company, Hillsboro, OR (US)

( * ) Notice: Subject to any disclaimer, the term of this patent is extended or adjusted under 35 U.S.C. 154(b) by 808 days.

(21) Appl. No.: 12/751,727

(22) Filed: Mar. 31, 2010

(65) Prior Publication Data

US 2010/0255213 A1 Oct. 7, 2010

(30) Foreign Application Priority Data

Apr. 2, 2009 (EP) .................................... 09157161

(51) Int. Cl.
*B05D 3/06* (2006.01)
*B29C 35/08* (2006.01)
*B29C 41/02* (2006.01)
*B29C 41/22* (2006.01)

(52) U.S. Cl.
USPC ............... 264/401; 264/28; 264/81; 264/255; 264/334; 264/485; 264/488

(58) Field of Classification Search
USPC .............. 264/28, 81, 255, 334, 401, 485, 488
See application file for complete search history.

(56) References Cited

U.S. PATENT DOCUMENTS

| | | | |
|---|---|---|---|
| 4,575,330 A | 3/1986 | Hull | |
| 4,929,402 A | 5/1990 | Hull | |
| 4,961,154 A * | 10/1990 | Pomerantz et al. | ....... 264/401 X |
| 5,059,266 A * | 10/1991 | Yamane et al. | ........... 264/401 X |
| 5,217,653 A | 6/1993 | Mashinsky et al. | |
| 5,545,367 A | 8/1996 | Bae et al. | |
| 5,554,336 A | 9/1996 | Hull | |
| 5,556,590 A | 9/1996 | Hull | |
| 5,569,431 A | 10/1996 | Hull | |
| 5,571,471 A | 11/1996 | Hull | |

(Continued)

OTHER PUBLICATIONS

Mager et al. "Phase Change Rapid Prototyping with Aqueous Inks", NIP23 and Digital Fabrication 2007 Conference Proceedings, pp. 908-911.*

(Continued)

*Primary Examiner* — Leo B Tentoni
(74) *Attorney, Agent, or Firm* — Scheinberg & Associates, PC; Michael O. Scheinberg; John B. Kelly

(57) ABSTRACT

A method for forming microscopic 3D structures. In the method according to the invention a substrate (105) is placed in a Scanning Electron Microscope (SEM). The SEM is equipped with a Gas Injection System (GIS) (110) for directing a jet of precursor fluid to the substrate. The substrate is cooled below the freezing point of the precursor gas so that a frozen layer of the precursor gas can be applied to the substrate. By now repeatedly applying a frozen layer of the precursor to the substrate and irradiate the frozen layer with an electron beam (102), a stack of frozen layers (130) is built, each layer showing an irradiated part (131) in which the precursor is converted to another material. After applying the last layer the temperature is raised so that the unprocessed precursor (132) can evaporate. As a result 3D structures with overhanging features can be built.

23 Claims, 3 Drawing Sheets

(56) References Cited

U.S. PATENT DOCUMENTS

| | | |
|---|---|---|
| 5,573,722 A | 11/1996 | Hull |
| 5,630,981 A | 5/1997 | Hull |
| 5,762,856 A | 6/1998 | Hull |
| 5,776,298 A * | 7/1998 | Franks ................... 264/28 X |
| 5,779,967 A | 7/1998 | Hull |
| 5,785,918 A | 7/1998 | Hull |
| 5,814,265 A | 9/1998 | Hull |
| 5,827,786 A | 10/1998 | Puretz |
| 6,401,002 B1 * | 6/2002 | Jang et al. ............ 264/401 X |
| 6,733,267 B2 | 5/2004 | Chapman et al. |
| 7,160,475 B2 | 1/2007 | Scipioni |
| 7,348,556 B2 | 3/2008 | Chitturi et al. |
| 7,524,431 B2 | 4/2009 | Branton et al. |
| 2004/0173759 A1 | 9/2004 | Koops et al. |
| 2005/0017414 A1 * | 1/2005 | Gurovich ................ 264/488 |
| 2005/0285312 A1 * | 12/2005 | Fury et al. ............... 264/401 |
| 2010/0159370 A1 | 6/2010 | Jong et al. |

OTHER PUBLICATIONS

Funsten, H.O., et al., 'Low-Temperature Beam-Induced Deposition of Thin Tin Films,' J. Appl. Phys., Feb. 1, 1992, pp. 1475-1484, vol. 71, Iss. 3.

Heymann, Jurgen A.W., et al., 'Site-Specific 3D Imaging of Cells and Tissues with a Dual Beam Microscope,' Journal of Structural Biology, 2006, pp. 63-73, vol. 155.

* cited by examiner

METHOD FOR FORMING MICROSCOPIC 3D STRUCTURES

TECHNICAL FIELD OF THE INVENTION

The invention relates to a method for forming a structure on a substrate, and more particularly to forming a structure on a substrate by forming multiple layers of a solid or liquid precursor material on the substrate surface and directing a particle beam at the precursor material.

BACKGROUND OF THE INVENTION

The invention relates to a method for forming a structure on a substrate, the method comprising:
providing a substrate, said substrate showing a surface,
repeatedly performing the steps of:
  a) adding a thin layer of a fluid with a predetermined thickness on the surface, the fluid forming a solid or liquid layer on the surface, the fluid being a precursor fluid, the layer defining a new surface,
  b) converting part of the precursor material to another material or to another physical state by irradiating part of the layer with particles, while the remaining part of the material stays on the surface,
the repeatedly performed steps of a) and b) followed by
  c) the removal of material,
the penetration depth of the particles sufficient to convert the precursor material over the complete thickness of one layer, the penetration depth of the particles insufficient to convert the precursor material that, immediately prior to step c), is closest to the substrate,
as a result of which a structure is build in which, prior to step c), unconverted precursor material may be sandwiched between the substrate and converted precursor material.

U.S. Pat. No. 4,575,330 discloses that a 3D object is formed from a fluid in the form of a liquid capable of solidification when irradiated with, for example, a focused beam of light, UV or electrons. By placing a substrate in a container of said liquid in such a way that the surface of said substrate is just submerged, and irradiating a part of the liquid on top of the substrate, said irradiated part of the liquid forms a solidified part adhered to the substrate. The irradiation may, for example, take the form of a focused beam of light, UV or electrons, the beam being scanned over the surface of the liquid in a predetermined pattern. As a result a first layer of solidified material in the form of the predetermined pattern is formed on the substrate. By now repeatedly submerging said structure so that a new thin layer on top of the already solidified material is formed, and exposing a part of the liquid, subsequent layers of solidified material are built upon each other, finally resulting in a solid 3D object submerged in the liquid. The solid 3D object is then taken out of the container with liquid, whereby the non-solidified material is removed. It is noted that repeatedly submerging the structure may be done by repeatedly lowering the substrate in the container of liquid, or may be done by repeatedly adding liquid to the container, thereby raising the level of non-solidified material in the container. The submerging should for each layer result in the formation of a thin layer with a predetermined thickness so that the dimensions of the structure are well controlled.

It is worth mentioning that the penetration depth of the particles should be more than one layer, so that the different layers overlap and therefore adhere well to each other, but must not be too large as the penetration depth equals the vertical resolution. Typically the penetration depth should be between one and two layer thicknesses.

The known patent mentions the use of electrons from an electron source for irradiating the liquids. However, the known patent fails to give examples of appropriate liquids. As known to the person skilled in the art, for electrons to travel from an electron source to a liquid, the volume between the electron source and the liquid should be evacuated. That the liquid is exposed to vacuum puts severe demands to the evaporation rate of the liquids, and therefore the liquids that can be used. Another problem is that exposing a liquid to a vacuum may change the composition of the liquid due to said evaporation, resulting in undesired effects.

A disadvantage of the known method is that the dimensions of the structures formed are limited by the minimum thickness of the layer of liquid that can be formed on the substrate and/or solidified material. When the predetermined thickness is too small, unreliable wetting of the substrate and/or non-uniform film thickness may result.

Another disadvantage of the known method is that it is limited in the sort of materials that can be used. The materials must be liquids that solidify when irradiated.

SUMMARY OF THE INVENTION

The invention relates to a method for forming microscopic 3D structures. In the method according to the invention a substrate is placed in a Scanning Electron Microscope (SEM). The SEM is equipped with a Gas Injection System (GIS) for directing a jet of precursor fluid to the substrate. The substrate is cooled below the freezing point of the precursor gas so that a frozen layer of the precursor gas can be applied to the substrate.

By now repeatedly applying a frozen layer of the precursor to the substrate and irradiate the frozen layer with an electron beam, a stack of frozen layers is built, each layer showing an irradiated part in which the precursor is converted to another material. After applying the last layer the temperature is raised so that the unprocessed precursor can evaporate. As a result 3D structures with overhanging features can be built.

BRIEF DESCRIPTION OF THE DRAWINGS

For a more complete understanding of the present invention, and the advantages thereof, reference is now made to the following descriptions taken in conjunction with the accompanying drawings, in which:
To this end.

DETAILED DESCRIPTION OF PREFERRED EMBODIMENTS

Figure 1:
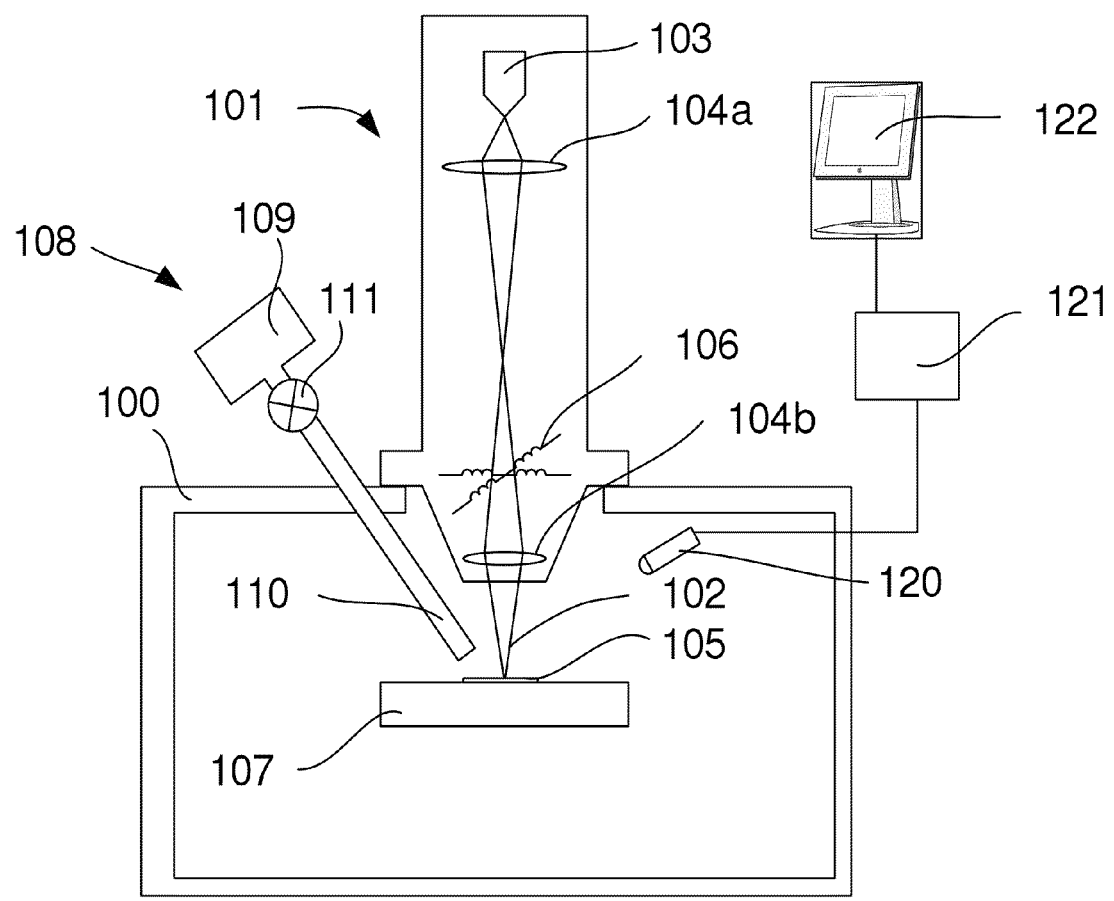
FIG. 1 schematically shows an apparatus equipped to perform the method according to the invention,
FIGS. 2A, 2B, 2C and 2D schematically show different intermediate states of a substrate on which a structure is formed.

The invention intends to provide a method for forming structures on a substrate with smaller dimensions than achievable with the aforementioned method. The invention further intends to provide a method for forming structures that may be used for other precursor materials.

To that end the invention is characterized in that steps a) and b) are performed in a vacuum, and the thin layer is formed by directing a jet of fluid to the substrate.

It is noted that because a sandwich of non-converted precursor material may be formed between converted precursor material and substrate, it is possible to fabricate structures with overhanging features, that is: structures in which between a converted, solidified precursor material and the substrate a void is present. It is further noted that a jet of fluid is directed to the substrate, but that this fluid may, depending on the temperature of the substrate when applying the fluid, freeze to the substrate.

It is noted that U.S. Pat. No. 5,827,786 discloses a method for forming insulating layers with a predetermined form on a substrate. In this known method a substrate is placed in the evacuable specimen chamber of a Focused Ion Beam (FIB) apparatus. The FIB comprises an ion source producing a beam of ions and particle-optical elements for focusing and positioning the beam of ions on the substrate. The FIB is equipped with a Gas Injection System (GIS), thereby enabling a jet of fluid, the precursor material, to be directed to the substrate. The GIS can direct the precursor material to the substrate so that molecules from the precursor material will adsorb to the surface of the substrate. The thickness of this layer is typically in the range of one mono-atomic layers. The finely focused beam of ions is scanned over the substrate in a predetermined pattern. Where the beam hits the substrate, secondary radiation in the form of secondary electrons is caused. These secondary electrons cause a dissociation of the adsorbed precursor material. Part of the dissociated precursor material forms a deposit, while another part of the precursor material is turned into gaseous by-products.

This method differs from the method of the invention in that the precursor does not form a liquid or solid layer on the surface, but is adsorbed to the surface. The thickness of the layer is governed by the balance of adsorption and desorption, thus depending on, for example, the partial gas pressure (determining how many molecules are adsorbed per second), and the sticking time (describing how long, on average, a molecule is adsorbed to the surface) The resultant layer is typically one or several mono-atomic layers, see e.g. "Low temperature beam-induced deposition of thin tin films", H. O. Funsten et al., J. Appl. Phys. 71 (3), 1 Feb. 1992, pages 1475-1484, more specifically in the introduction.

Although it may seem of little consequence that in this known method precursor adsorbs, the result is that no structures with overhanging features can be found. This is explained as follows:
In this known method a very thin layer is formed, and when a part of the layer is irradiated, it forms, for example, a solidified product. Immediately new precursor adsorbs to the formed structure and forms a fresh thin layer. The surface will thus follow the relief formed by the solidified parts, and never a non-solidified layer forms under a solidified layer. As a result in this known method no sandwich of unconverted precursor material between converted material and substrate can be formed.
Therefore no structures with overhanging features can be formed.

This is contrary to method according to the invention, where a liquid or solid layer is formed on the substrate, and when a part of the layer is, for example, solidified, a fresh layer of precursor material is formed on both the irradiated and the non-irradiated parts.

It is noted that the material may be converted to a chemically different material. This is, for example, the case when a metallo-organic precursor is used that is dissociated by the irradiation, resulting in a metallic deposit. However, conversion of the precursor material may also take the form of, for example, polymerization.

In an embodiment of the method according to the invention the particles are charged particles.

Many removable materials that can be converted with a charged particle beam into non-removable materials (or vice versa) are known per se. Such materials are known from e.g. Electron Beam Induced Deposition (EBID) and Ion Beam Induced Deposition (IBID).

In another embodiment of the method according to the invention the particles are photons.

The photons may have a wave length of visible light, but may also be e.g. ultra-violet photons or X-ray photons.

In yet another embodiment of the method according to the invention the material removed in step c) is irradiated precursor material.

In this so-named negative process the material removed is the material irradiated with particles.

In still another embodiment of the method according to the invention the material removed in step c) is non-irradiated precursor material.

In this so-named positive process the material removed is the material that is not irradiated with particles. This group of materials includes the materials normally used for EBID and IBID, as these materials normally desorb from a surface if not irradiated.

In still another embodiment of the method according to the invention the temperature of the substrate is kept below the freezing point of the precursor material while performing step a) and b), as a result of which a frozen layer is formed in step a).

By freezing a layer of precursor material on the substrate, and then irradiating the frozen layer, a part of the precursor material can be converted to a material with e.g. another evaporation temperature of sublimation temperature than the other part of the precursor material. This temperature difference can be used in step c) to differentiate between which part of the precursor material is removed (the part with the lowest evaporation or sublimation point) and which part of the material that stays on the substrate. The temperature used may be cryogenic temperatures, e.g. the temperature of liquid nitrogen or liquid helium, but it may also be a temperature below room temperature but above cryogenic temperatures, such as can be achieved with e.g. Peltier cooling. Also temperatures equal to or above room temperature may for certain precursor materials result in frozen layers.

It is noted that often the structure thus formed will be stored and/or be used at room temperature or even higher temperatures. If so, the part of the material that stays on the substrate should have a melting point and sublimation temperature above said room temperature or said higher temperature.

In still another embodiment of the method according to the invention step c) takes the form of evaporating or sublimating material.

Evaporating or sublimating material is a convenient method to remove frozen or liquid material from delicate structures on a substrate.

In still another embodiment of the method according to the invention the particles are focused in a pencil beam that is scanned over the substrate in a predetermined pattern.

This method of forming a pattern is well-known for charged particles from electron-beam lithography, EBID and IBID. However, also a pencil beam of photons can be scanned over the surface by using appropriate deflection means, such as deflectable mirrors.

In still another embodiment of the method according to the invention the particles form a pattern on the layer in the form of an image of a projection mask, said pattern imaged on the substrate with a projection lens.

Forming a pattern from a projection mask is known from optical projectors, but also from charged particle beam projection systems. The image projected on the layer may be scale 1:1, but it may also be e.g. a demagnified image of the mask, as is often used in lithographic tools used in the semiconductor industry In still another embodiment of the method according to the invention the particles form a pattern on the layer in the form of an image of a proximity mask, the thin layer positioned between the substrate and the proximity mask.

The use of proximity masks is known per se from e.g. X-ray lithography. A proximity mask is a 1:1 mask placed close to the surface to be irradiated, and e.g. a parallel beam of X-rays irradiates the mask.

In still another embodiment of the method according to the invention the same precursor is used for the repeated applications of a precursor in step a).

In this embodiment a structure consisting of one material is build.

In still another embodiment of the method according to the invention at least two different precursors are used for the multiple applications of a precursor in step a).

In this embodiment a structure comprising at least two materials is build. It is noted that the at least two materials will be arranged in layers. Even the use of only two precursor materials may result in a multitude of (alternating) layers.

In still another embodiment of the method according to the invention the precursor material comprises a metal atom.

Precursors comprising metal atoms are well known for EBID and IBID. Often these precursors are organometallic molecules. Examples are e.g. tungstenhexacarbonyl [W(CO)$_6$], methylcyclopentadientyltrimethyl platinum [(CH$_3$)$_3$Pt(CpCH$_3$)], tetraethylorthosilicate (TEOS), (CH$_3$)$_4$Sn, and many others, although also inorganic precursors may be used, such as WF$_6$ and SnCl$_4$. Such precursor materials decompose when irradiated, forming a deposit comprising the metal on the substrate and gaseous by-products. The deposit may also comprise other atoms, such as carbon atoms resulting from the decomposition.

It is noted that, when the temperature of the substrate during steps a) and b) is e.g. a cryogenic temperature, the gaseous by-products or part of the gaseous by-products may also freeze on the substrate, to be evaporated when removing the material in step c) and heating it to, for example, room temperature.

In still another embodiment of the method according to the invention the thin layer of precursor material comprises at least two types of molecules that, when irradiated, chemically react with each other.

The invention is now explained on the hand of figures, in which identical reference numerals relate to corresponding features.

To this end:

FIG. 1 schematically shows an apparatus equipped to perform the method according to the invention, FIGS. 2A, 2B, 2C and 2D schematically show different intermediate states of a substrate on which a structure is formed, FIG. 1 schematically shows an apparatus equipped to perform the method according to the invention, FIG. 1 schematically shows a particle column in the form of an electron beam column 101 mounted on an evacuable specimen chamber 100. The specimen chamber may be evacuated by e.g. a turbo-molecular pump, or other known pumping means such as oil diffusion pumps, ion getter pumps, scroll pumps, etc. The electron beam column comprises an electron source 103 for producing electrons and electron-optical lenses 104a, 104b forming a finely focused beam of electrons 102. The beam of electrons can be positioned on and can be scanned over the surface of a substrate 105 with deflection unit 106. It is noted that lenses and deflection unit may use electric fields to manipulate the electron beam, or that magnetic field may be used, or a combination thereof. Such columns, used in e.g. electron microscopes and the like, are capable of forming a beam with a focal diameter of typically several nanometres to less than 1 nm in diameter. The energy of the electrons in the focus may be varied, as a result of which electrons with an energy of typically between 100 eV and 30 keV are focused on the substrate, although higher and lower energies are known to be used.

The substrate is mounted on a cooled stage 107 for positioning the substrate. The cooling may be achieved with a Peltier unit, or for example by a thermal braid connected to a cold source such as a container containing a cryogenic fluid such as liquid nitrogen.

Mounted on the vacuum chamber is a Gas Injection Systems (GIS) 108. The GIS comprises a reservoir 109 for holding the precursor material and a capillary 110 for directing the precursor material to the surface of the substrate. The GIS further comprises means 111 for regulating the supply of precursor material to the substrate. In this example the regulating means are depicted as an adjustable valve, but the regulating means may also take the form of e.g. controlled heating of the precursor material.

Also included is a secondary electron detector 120. Such a detector may be, for example, a Everhard-Thornley detector, or a semiconductor device capable of detecting low energy electrons. The signal of the detector is fed to a controller 121. Said controller also controls the deflector signals, lenses, electron source, GIS, stage and pump, and other items of the instrument. Monitor 122 is used to display an image of the substrate using the signal of the detector 120.

FIGS. 2A, 2B, 2C and 2D schematically show different intermediate states of a substrate on which a structure is formed.

Figure 2A:
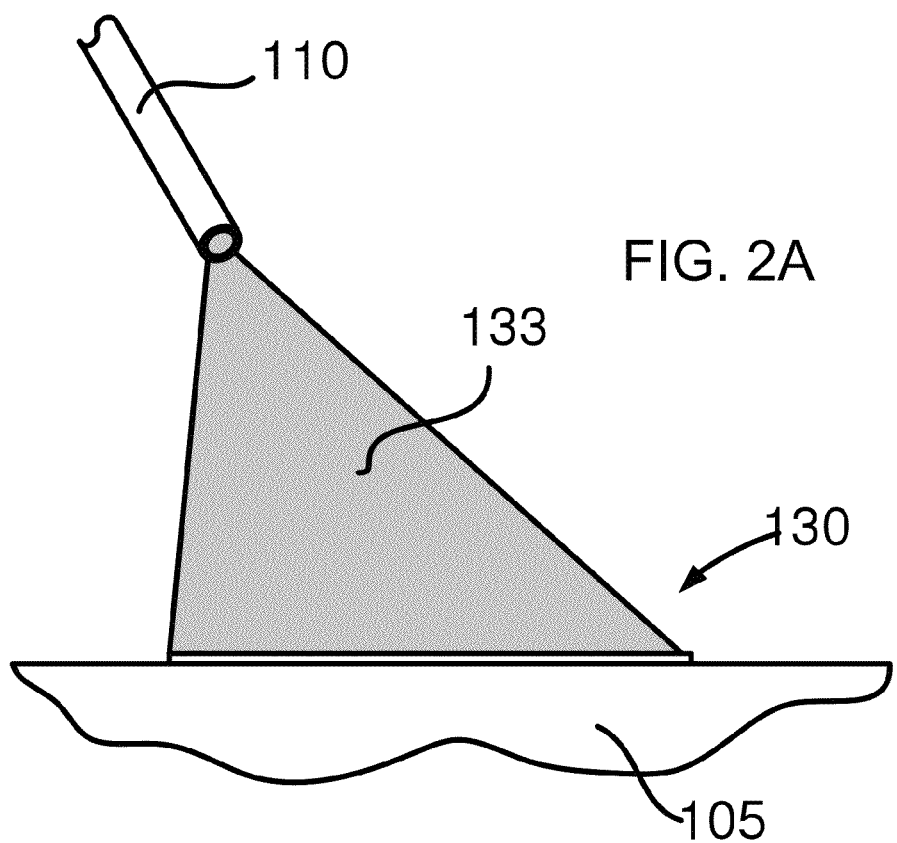

FIG. 2A schematically shows a substrate 105, on which a precursor fluid 133 emanating from the capillary 110 of a GIS is directed to the substrate 105.

By positioning the GIS to the cooled substrate, and allowing an amount of precursor fluid to be directed to the substrate, said amount of precursor material freezes to the substrate. The surface area that is covered with the precursor material is governed by the distance from the nozzle of the capillary to the substrate, and the form of the nozzle.

It is noted that this layer of precursor material does not desorb due to the low temperature of the substrate. In this the process according to the invention differs from standard EBID, as in standard EBID there is a balance of adsorption and desorption of precursor material, and the thickness of the layer of precursor material would desorb at the moment no precursor fluid is directed to the surface anymore.

Figure 2B:
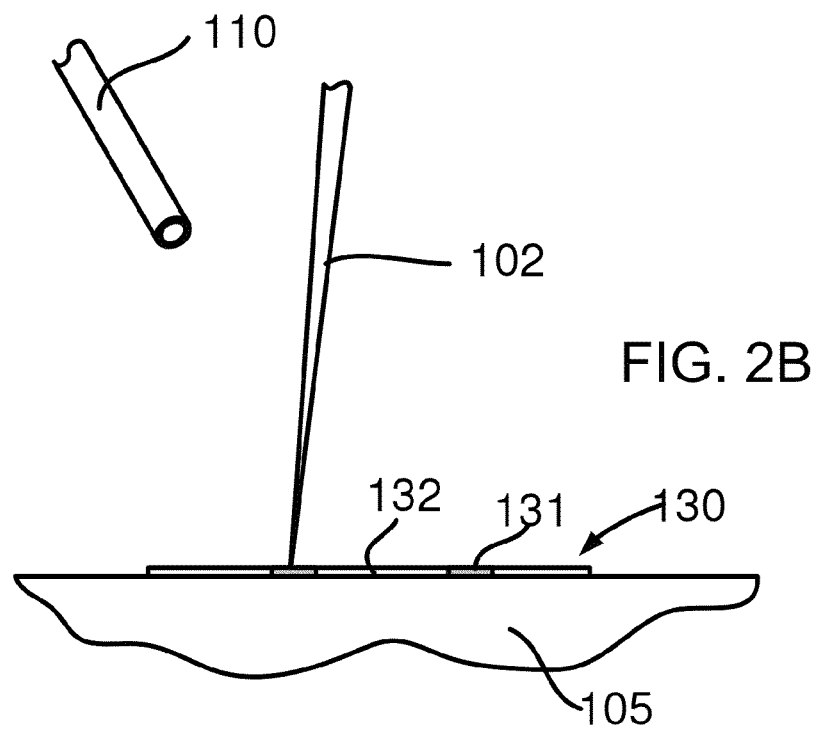

FIG. 2B schematically shows a finely focused beam of electrons 102 that is scanned over parts of the layer of precursor material. As a result the layer of precursor material show parts 131 that are irradiated and parts 132 that are not irradiated by the electron beam 102. The energy of the electrons is chosen to be sufficiently high to cause a change of precursor material over the complete thickness of the layer.

On top of this layer a fresh layer of precursor material can be deposited. Again a pattern is written on the surface, thereby forming a second pattern of irradiated precursor material.

It is noted that, when using the same geometry between capillary and substrate, and controlling the amount of fluid in the same way, a further layer with the same or almost the same thickness can be deposited. By changing one of the parameters (e.g. the time during which the fluid is directed to the substrate, or the flux of fluid) in a known way, a layer with a known thickness ratio when compared to the first layer may be deposited.

It is further noted that only one precursor fluid may be used, but also alternating layers of different precursors may be used by equipping the apparatus with more than one GIS.

It is also possible to apply two precursors to one layer. The resultant converted precursor may comprise the conversion products of each of the precursors, or it may comprise, for example, a product obtained by the chemical reaction of the precursor fluids or its products with each other.

Figure 2C:
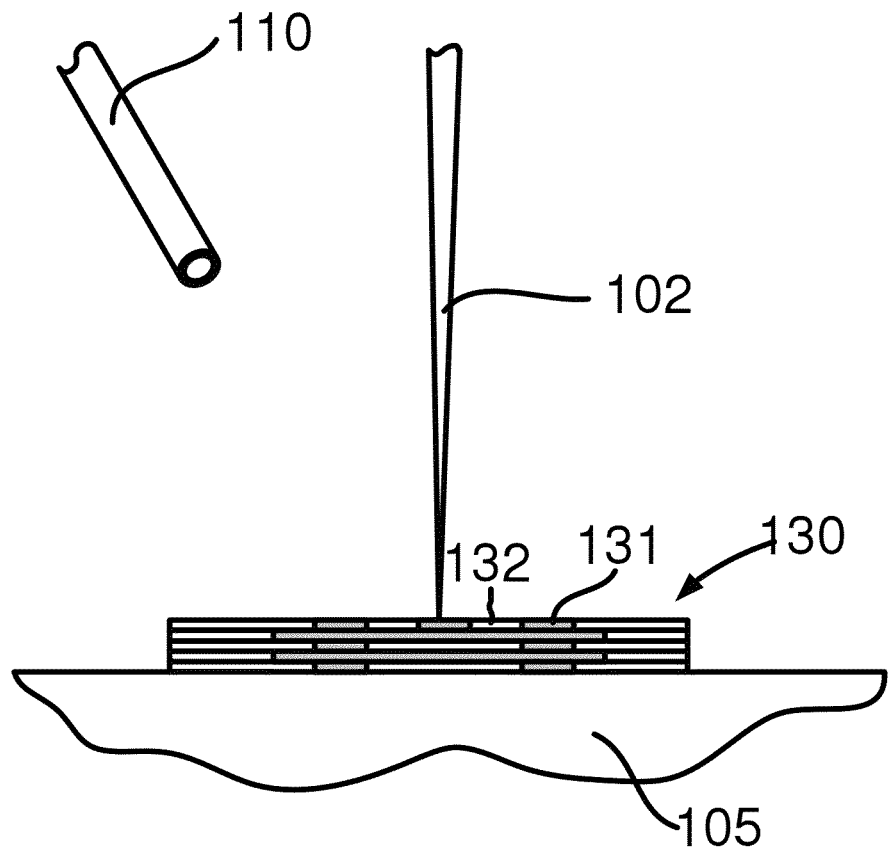

FIG. 2C schematically shows a stack of layers 130, each layer showing its own pattern 131 of irradiates precursor material and its own pattern 132 of non-irradiated precursor material. The energy of the electrons, chosen sufficiently high to cause a change of the precursor material over the complete thickness of the layer, is chosen sufficiently low to avoid a change of the precursor material in the whole thickness of the underlying layer. However, for a good adherence of the two layers, an overlap is needed. A penetration depth of between 1 and 2 layer thicknesses is preferred.

Figure 2D:
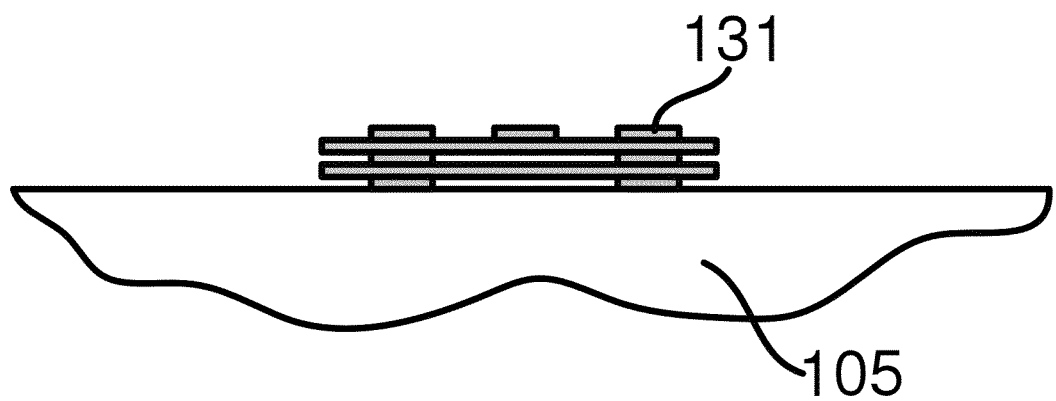

FIG. 2D schematically shows the structure that is formed on the substrate after removing material. It is assumed here that the non-irradiated material is removable by e.g. heating the substrate to room temperature, the non-irradiated precursor material evaporating or sublimating to the environment. As a result a structure is formed, which may comprise overhanging parts.

It is noted that, by alternating use of different precursor materials for different layers, a structure can be formed with different layers of converted precursor material.

It is further noted that the process can be a so-named positive process, in which the material removed in step c) is non-irradiated material, but that it may also be a so-named negative process, in which the removed material is the irradiated precursor material.

The thickness of the first layer can be determined empirically, or it may be determined by measuring the thickness of the layer. Measurement systems capable of measuring the thickness of films are known per se.

A very advantageous method for determining the energy needed to traverse through one layer of precursor material is by measuring the amount of backscattered electrons with a backscatter detector. A backscatter electron is generally defined as an electron emerging from the irradiated material with an energy of more than 50 eV. When the energy of the electrons is low, all electrons are absorbed in the precursor material and any backscattered electrons come from the precursor layer. When raising the energy of the electrons, at a certain energy part of the electrons will reach the underlying material and will cause backscattering from the material of the substrate. As in most cases the backscatter coefficient of the precursor material and the substrate material differ, this can be observed as a change in backscatter signal.

The advantage of this method for measuring the amount of deposited precursor material is that it directly shows the energy needed to pass through one layer.

It is noted that the thickness can be measured on a part of the layer where the layer should be irradiated to form the structure, but that it may also be measured on a spatially removed part of the substrate, where the formation of an additional structure due to said measurement is of no importance.

It is further noted that, by measuring the thickness of the first layer deposited on the substrate, the person skilled in the art can deposit a layer with a thickness with a known ratio to the thickness of the first layer.

It is mentioned that this method can be used 'as such', indicating that electrons traversed through the whole layer. There is a chance that the energy thus determined is much higher than necessary. This can be explained as follows: when the energy is just sufficient to reach the substrate, many of the electrons backscattered by the substrate have an even lower energy than the impinging electrons. As a result most of the backscattered electrons are absorbed in the precursor layer. Only at a much higher energy, presumably twice as high than needed for traversing the layer once, a distinct change in backscatter signal can be expected. However, by comparing the energy thus found with an earlier determined calibration series of this method, the energy can then be reduced to the required energy.

Another method for determining the energy needed to traverse through one layer, resembling the method described earlier is by detecting X-rays generated by the electron beam instead of backscattered electron. By selectively detecting characteristic X-rays of an element in the substrate, said element not occurring in the precursor layer, it can be determined at which energy the electrons reach the substrate.

Even better results are obtained by comparing the signal of the characteristic X-rays of the substrate material with the signal of characteristic X-rays of another material, said other material present the precursor. By comparing this ratio with a predetermined calibration series the thickness of the layer can be determined with high accuracy. It is mentioned that said other material may be present in the precursor only, but may also be present in both the precursor and the substrate.

Although the invention is explained on the hand of an electron beam apparatus only, the person skilled in the art will recognize that the invention can be applied to FIB apparatus, lithographic tools (also known as steppers) as used in the semiconductor industry, and the like.

We claim as follows:

1. A method for forming a structure on a substrate, the method comprising:
    providing a substrate, said substrate showing a surface on which the structure is built;
    repeatedly performing the steps of:
        a) adding a thin layer of a fluid precursor material with a predetermined thickness on the surface, the fluid precursor material forming a solid or liquid layer on the surface, the layer defining a new surface;
        b) converting part, but not all, of the precursor material to another material or to another physical state by irradiating part of the layer with particles, while the unconverted part of the precursor material stays unconverted on the surface;
    the repeatedly performed steps of a) and b) followed by:
        c) the removal of part, but not all, of the precursor material;
    the penetration depth of the particles sufficient to convert the precursor material over the complete thickness of one layer, the penetration depth of the particles insufficient to convert the precursor material that, immediately prior to step c), is closest to the substrate,
    as a result of which a structure is built in which, prior to step c), unconverted precursor material is sandwiched between the substrate and converted precursor material, wherein:
        steps a) and b) are performed in a vacuum, and
        the thin layer is formed by directing a jet of fluid to the substrate.

2. The method of claim 1 in which the particles are charged particles.

3. The method of claim 1 in which the particles are photons.

4. The method of claim 1 in which the material removed in step c) is irradiated precursor material.

5. The method of claim 1 in which the material removed in step c) is non-irradiated precursor material.

6. The method of claim 1 in which during steps a) and b) the temperature of the substrate is kept below the freezing point of the precursor material, as a result of which step a) results in the formation of a frozen layer.

7. The method of claim 1 in which step c) takes the form of evaporating or sublimating material.

8. The method of claim 1 in which the particles are focused in a pencil beam that is scanned over the substrate in a predetermined pattern.

9. The method of claim 1 in which the particles form a pattern on the layer in the form of an image of a projection mask, said pattern imaged on the substrate with a projection lens.

10. The method of claim 1 in which the particles form a pattern on the layer in the form of a proximity mask, the thin layer positioned between the substrate and the proximity mask.

11. The method of claim 1 in which for the repeated applications of a precursor in step a) the same precursor is used.

12. The method of claim 1 in which for the repeated applications of the precursor in step a) at least two different precursors are used.

13. The method of claim 1 in which the precursor material comprises a metal atom.

14. The method of claim 1 in which the thin layer of precursor material comprises at least two types of molecules that, when irradiated, chemically react with each other.

15. A method for forming a structure on a substrate, the method comprising;
    placing the substrate in a vacuum chamber;
    forming a structure by:
    (a) directing a jet of precursor fluid at the surface of the substrate to form solid or liquid layer of precursor material having a predetermined thickness on the surface, the precursor material reacting in the presence of the particle beam to form a desired solid material that is used to form a structure on the substrate;
    (b) irradiating a part, but not all, of the precursor material layer with a particle beam, the irradiated part of the precursor material converting in the presence of the particle beam into the desired solid material, the particle beam having sufficient energy to cause the reaction of precursor material for the complete predetermined thickness of the layer, and not irradiating the remaining part of the precursor material layer with the particle beam;
    (c) directing a jet of precursor fluid at the surface of the substrate to form an additional solid or liquid layer of precursor material having a predetermined thickness on the surface, said additional layer formed on top of the irradiated and non-irradiated parts of the previous layer;
    (d) irradiating a part, but not all, of the additional precursor material layer with a particle beam, the precursor material converting in the presence of the particle beam into the desired solid material, the particle beam having sufficient energy to cause the reaction of precursor material for the complete predetermined thickness of the additional layer, but the penetration depth of the particle beam being insufficient to convert non-irradiated precursor material in the previous layer, and not irradiating the remaining part of the additional precursor material layer with the particle beam;
    (e) repeating steps (a) through (d) until the desired structure has been formed; and
    removing the non-irradiated precursor material from the substrate surface to leave the desired structure of solid material on the substrate.

16. The method of claim 15 in which during steps (a) through (e) the temperature of the substrate is kept below the freezing point of the precursor material, as a result of which step (a) results in the formation of a frozen layer.

17. The method of claim 15 in which irradiating a part of the precursor material layer with a particle beam, the precursor material converting in the presence of the particle beam into the desired solid material comprises irradiating a part of the precursor material layer with a particle beam, the precursor material reacting in the presence of the particle beam to form a precipitate material and a by-product material.

18. The method of claim 17 further comprising removing the by-product material from the substrate surface.

19. The method of claim 16 in which the non-irradiated precursor material is removed by warming the substrate to a temperature above the freezing point of the precursor material.

20. The method of claim 15 in which the particle bean comprises a charged particle beam.

21. The method of claim 15 in which the structure formed has overhanging features.

22. The method of claim 15 in which the precursor material forms a solid or liquid layer on the surface and does not desorb from the surface at the temperature of the substrate during steps (a) through (e).

23. The method of claim 15 in which, as a result of the parts of the precursor material layers irradiated by the particle beam in steps (a) through (d), at least one layer of solid material is formed on top of non-irradiated precursor material.

* * * * *